United States Patent [19]

Raza

[11] Patent Number: 5,565,791
[45] Date of Patent: Oct. 15, 1996

[54] METHOD AND APPARATUS FOR DISABLING UNUSED SENSE AMPLIFIERS

[75] Inventor: S. Babar Raza, Sunnyvale, Calif.

[73] Assignee: Cypress Semiconductor Corporation, San Jose, Calif.

[21] Appl. No.: 498,622

[22] Filed: Jul. 7, 1995

[51] Int. Cl.$^6$ ............................................. H03K 19/173
[52] U.S. Cl. ............................. 326/38; 327/544; 365/227
[58] Field of Search ................................. 326/38; 327/51, 327/544; 365/189.07, 227

[56] References Cited

U.S. PATENT DOCUMENTS

| | | | |
|---|---|---|---|
| 4,851,720 | 7/1989 | Pathak et al. | 327/544 |
| 4,959,564 | 9/1990 | Steele | 326/38 |
| 4,963,769 | 10/1990 | Hiltpold et al. | 326/38 |
| 5,138,198 | 8/1992 | Shen et al. | 326/38 |
| 5,247,213 | 9/1993 | Trinh et al. | 326/38 |
| 5,281,873 | 1/1994 | Seki | 327/544 |

*Primary Examiner*—Edward P. Westin
*Assistant Examiner*—Richard Roseen
*Attorney, Agent, or Firm*—Blakely, Sokoloff, Taylor & Zafman

[57] ABSTRACT

A programmable circuit includes: (a) a plurality of programmable cells; (b) a sense amplifier for detecting states of the plurality of programmable cells; (c) a programmable unit for receiving a signal from the sense amplifier; (d) a configuration circuit for configuring the programmable unit; and (e) a sense control circuit coupled to the sense amplifier and to the configuration circuit for enabling or disabling the sense amplifier using a configuration signal of the configuration circuit. The programmable circuit may further include: (f) a second programmable unit for receiving the signal from the sense amplifier; and (g) a second configuration circuit for configuring the second programmable unit, where the sense control circuit is coupled to the second configuration circuit for enabling or disabling the sense amplifier using a second configuration signal of the second configuration circuit. The sense control circuit may include an OR gate but typically does not include programmable devices so that the sense control circuit can be a simple and small device. The sense amplifier may include: a first multiplexer coupled to the sense control circuit, a second multiplexer coupled to the sense control circuit, and a disable circuit. The configuration signal of the configuration circuit may be used not only for enabling or disabling the sense amplifier but also for configuring the programmable unit.

22 Claims, 7 Drawing Sheets

| DEVICE | Old $I_{cc}$ (mA) | New $I_{cc}$ (mA) | Delta (mA) |
|---|---|---|---|
| 7C371 | 133.64 | 1.72 | 131.92 |
| 7C372/373 | 134.85 | 3.44 | 131.40 |
| 7C374/375 | 269.69 | 6.88 | 262.81 |

FIGURE 7

| DEVICE | Old $I_{cc}$ (mA) | New $I_{cc}$ (mA) | Delta (mA) |
|---|---|---|---|
| 7C371 | 104.15 | 67.68 | 36.46 |
| 7C372/373 | 110.42 | 69.14 | 41.28 |
| 7C374/375 | 220.85 | 138.28 | 82.56 |

METHOD AND APPARATUS FOR DISABLING UNUSED SENSE AMPLIFIERS

BACKGROUND OF THE INVENTION

1. Field of the Invention

The present invention relates to the field of programmable circuits and, in particular, to programmable logic devices.

2. Description of Related Arts

FIG. 1 shows a typical programmable circuit 30 such as a programmable logic device which contains an array of logic gates that can be connected or programmed to perform various functions. Programmable circuit 30 includes a product term array 10, a plurality of sense amplifiers 1 through m, product term matrix (PTM) blocks/OR gates 40-1 through 40-k, configuration bits blocks 42-1 through 42-k, macrocell blocks 44-1 through 44-k, and output drivers 46-1 through 46-k. Product term array 10 and sense amplifiers 1 through m form a programmable AND plane, and PTM blocks/OR gates 40-1 through 40-k and configuration bits blocks 42-1 through 42-k form a programmable OR plane.

Product term array 10 is used to implement programmable AND functions. Product term array 10 includes rows of programmable cells where each of the cells can be either erased or programmed. Each of the programmable cells receives a true input (such as input 11 or input m1) or a bar input (such as input $\overline{11}$, input $\overline{1n}$, input $\overline{m1}$, or input $\overline{mn}$). A bar input is usually an inverted signal of its true input. Because input 11 is a true input while input $\overline{11}$ is a bar input, if input 11 receives a logic 1, then input $\overline{11}$ receives a logic 0. Product term array 10 can be programmed according to desired AND equations by providing appropriate logic values to its inputs, and by programming or not programming each of the cells appropriately.

Each of sense amplifiers 1 through m is used to detect the logic states of its corresponding row of the programmable cells in product term array 10. In a given row, if any of the programmable cells conducts, then its corresponding sense amplifier's output is typically low for a noninverting sense amp and high for an inverting sense amp. If, on the other hand, none of the programming cells in a given row conducts, then its corresponding sense amplifier's output is high for noninverting sense amp. A detailed circuit schematic representation of the programmable cells and a sense amplifier will be shown later in FIG. 2.

PTM blocks/OR gates 40-1 through 40-k are used to implement OR functions. Each of the sense amps 1 through m can be connected to one or more PTM blocks/OR gates 40-1 through 40-k.

Configuration bits blocks 42-1 through 42-k are used to configure their corresponding PTM blocks/OR gates. For instance, if sense amplifiers 1, 3, 5, and 7 are connected to PTM block/OR gate 40-1, then configuration bits block 42-1 provides a configuration bit for each of sense amplifiers 1, 3, 5, and 7. The outputs of sense amplifiers 1, 3, 5, and 7 are either used or not used in the PTM block/OR gate 40-1 depending on the states of their corresponding configuration bits provided by configuration bits block 42-1. The operation of PTM blocks/OR gates and configuration bits blocks will be described more in detail later with respect to FIG. 3.

Each of macrocell blocks 44-1 through 44-k can be implemented as a latch, D register, or T register. Each of output drivers 46-1 through 46-k is used to drive an output from its corresponding macrocell block.

FIG. 2 is a combination of a block diagram and a circuit schematic representation of a first row of product term array 10 and sense amplifier 1 in FIG. 1. A programmable cell may be implemented in various way. An example of a programmable cell, such as cell 11a, typically includes (a) a transistor for receiving an input and (b) a nonvolatile cell. Cell 11a includes an NMOS transistor M10 for receiving input 11 and a nonvolatile cell 11 which includes two floating gate devices M12 and M14. Floating gate device M12 can be either erased (e.g., the floating gate of the non-volatile cell is not programmed or the nonvolatile cell is capable of conducting) or programmed. Floating gate device M14 is used to erase floating gate device M12. Similarly, cell 11b is constructed in the same manner as cell 11 (etc.).

In operation, if floating gate device M12 is erased and input 11 is high, then both transistors M10 and M12 conduct. If a reference voltage Vref 1 is applied, then a current limiting device M28 conducts, and A11 is pulled down low. When any one of the cells is erased and its corresponding M10, a pass gate, is on, line A11 is low regardless of the states of other programmable cells. Thus, when cell 11a is on (conducting), line A11 is low. Line A11 is in a high state only if all of the programmable cells in the row are programmed, or for the unprogrammed cells, the corresponding M10 devices are off, (i.e., not conducting). Thus SAout in FIG. 3 acts as an output of the programmable AND plane while the inputs to the programmable cells act as inputs to the programmable AND plane.

As described above, the entire cell 11a is on (conducting), if floating gate transistor M12 is erased, and input 11 is high. If, on the other hand, input 11 is low, and the pass gate M10 is off, line A11 is high regardless of whether the nonvolatile transistor ME12 is erased or programmed. Also, line A11 is high, if nonvolatile transistor M12 is programmed regardless of whether input 11 is high or low.

Continuing to refer to FIG. 2, sense amplifier 1 includes., in one embodiment, three gain stages (a stage 1, a stage 2, and a stage 3) and current limiting device M28. Sense amplifier 1 includes three gain stages so that full rail logic levels can be achieved at a sense amplifier output node (SAout) 1. It will be appreciated that other embodiments of sense amps may be used.

In operation, if line A11 is low, then a node 1 in sense amplifier 1 is high, turning on a transistor M26 so that SAout 1 is low. If, on the other hand, line A11 is high, then node 1 is low, turning off transistor M26. When a reference voltage Vref 2 is applied, a transistor M24 conducts, and thus SAout 1 is high. While the logic levels at line A11 do not reach the full rail logic levels, the logic levels at SAout 1 reach the full rail logic levels.

Current limiting device M28 is provided to limit the current that can be drawn from product term array 10.

FIG. 3 is a combination of a block diagram and a circuit schematic representation of PTM block/OR gate 40-1. It will be appreciated that FIG. 3 shows one embodiment of the PTM blocks and other embodiments may be used. PTM block/OR gate 40-1 can be connected to any number of the sense amplifiers in FIG. 1. For illustration purposes only, in FIG. 3, PTM block/OR gate 40-1 is connected to sense amplifiers 1, 2, and m. The output signals of the sense amplifiers 1, 2, and m are shown as SAout 1, SAout 2, and SAout m, respectively. SAout 1 is an input for a transistor M44, SAout 2 is an input for a transistor M46, and SAout m is an input for a transistor M48.

For each of the sense amplifiers that is connected to PTM block/OR gate 40-1, configuration bits block 42-1 in FIG. 2 provides a configuration bit. Configuration bits cf1, cf2, and cfm are provided for sense amplifiers 1, 2, and m, respectively. If SAout 1 is to be used in PTM block/OR gate 40-1, then cf1 is high. Similarly, if SAout 2 or SAout m is to be used in PTM block/OR gate 40-1, then cf2 or cfm, respectively, is high.

Typically, a configuration bit is high if the configuration cell that produces the configuration bit is programmed, and a configuration bit is low if the configuration cell of the configuration bit is erased. The structure of a configuration cell is similar to the structure of a programmable cell such as cell 11a shown in FIG. 2.

In FIG. 3, if a configuration bit is high, then its corresponding sense amplifier output can affect the value at line C, that is, the sense amplifier output is used in PTM block/OR gate 40-1. However, if a configuration bit is low, then its corresponding sense amplifier output does not affect the output at line C, that is, the sense amplifier output is blocked from being used in PTM block/OR gate 40-1. For instance, if cf1 is high, then line C can be affected by SAout 1. In that instance, if SAout 1 is high, then line C is low. If, on the other hand, cf1 is low, then transistor M54 is off, and line C is not affected by SAout 1.

An OR sense amplifier (ORSAmp) 60 is a sense amplifier which may be similar in structure to sense amplifier 1 shown in FIG. 2. Thus, the detailed circuit schematic representation of ORSAmp 60 is omitted. ORSAmp 60 detects the logic level at line C and provides the full rail logic level at its output node ORSAout 63.

Since sense amplifiers such as sense amplifiers 1 through m consume a large amount of power when they are not used, it is beneficial to disable any unused sense amplifiers. Conventionally, there are three ways of disabling unused sense amplifiers. First, a sense amplifier can be disabled in a high current state (for the current embodiment) if all of the programmable cells connected to the sense amplifier are erased. For example, in FIG. 2, if all of programmable cells 11a, 11b, ..., cell 1nb are erased, then since half of the cells are connected to true inputs while the other half of the cells are connected to bar inputs, some of the cells must conduct, and thus line A11 becomes low. Hence, SAout 1 is pulled low regardless of the input values. In this instance, sense amplifier 1 is disabled (for the current embodiment) in a high current state because a large current flows from some of the programmable cells through M28, and all of the stages conduct current.

Second, a sense amplifier can be disabled in a low current state (for the current embodiment) if all of the programmable cells connected to the sense amplifier are programmed. For instance, in FIG. 2, if all of the programmable cells (cell 11a, cell 11b, ..., cell 1nb) are programmed, then regardless of the input values, line A11 is high. Hence, SAout 1 is pulled up high. In this instance, sense amplifier 1 is disabled (for this embodiment) in a low current state and only stage 2 burns significant current.

Third, a sense amplifier can be disabled by including additional circuitries, as shown in FIG. 4. A programmable circuit 30' shown in FIG. 4 is the same as programmable circuit 30 in FIG. 1 except that programmable circuit 30' includes disabling configuration bit blocks 41'-1 through 41'-m used to disable sense amplifiers 1' through m'. Disabling configuration bit blocks include configuration bit cells, configuration bit sense amplifiers, and other programming circuits.

Conventional schemes of disabling unused sense amplifiers have several drawbacks. Although the first scheme described above does not require any additional circuitry to disable an unused sense amplifier, that scheme is disadvantageous because it consumes a large amount of current.

The second scheme can be more advantageous than the first scheme because the disabled sense amplifiers consume less current than those sense amplifiers disabled according to the first scheme. However, the second scheme requires programming of the programmable cells in the product term array. Also, although the disabled sense amplifiers are in a low current state, the sense amplifiers still consume a large amount of current. In addition, because of the significant power consumed by the disabled sense amplifiers, the operating temperature of the circuit increases, and hence, the circuit performance degrades.

The third scheme may be more advantageous over the first two schemes described since the sense amplifiers disabled by the third scheme consume only a minimum or no power. However, the third scheme requires an additional disabling configuration bit circuitry for each sense amplifier where the disabling configuration bit circuitries include configuration bit cells similar to programmable cells of product term array 10' in FIG. 4, configuration bit sense amplifiers, and other programming circuits such as input term decoders, product term decoders, etc. Hence, disabling configuration bit circuitries can become complex.

Therefore, it is desirable to be able to disable sense amplifiers at a minimum current level while requiring the least amount of circuitry. This can be achieved by utilizing the configuration bits that are used by the PTM block/OR gate configuration bits blocks.

SUMMARY OF THE INVENTION

The present invention provides the capability of disabling sense amplifiers of a programmable circuit in a nearly zero power state by manipulating configuration bits issued by configuration circuits. In particular, the present invention can be utilized to disable the AND plane sense amplifiers of a programmable logic device in a nearly zero power state using the configuration bits issued by the OR plane configuration circuits.

A programmable circuit of the present invention typically includes: (a) a plurality of programmable cells; (b) a sense amplifier for detecting states of the plurality of programmable cells; (c) a programmable OR/PTM block for receiving a signal from the sense amplifier; (d) a configuration circuit for configuring the programmable OR/PTM block; and (e) a sense control circuit coupled to the sense amplifier and to the configuration circuit for enabling or disabling the sense amplifier using a configuration signal of the configuration circuit.

The programmable circuit may further include: (f) a second programmable OR/PTM block for receiving the signal from the :sense amplifier; and (g) a second configuration circuit for configuring the second programmable OR/PTM block, where the sense control circuit is coupled to the second configuration circuit for enabling or disabling the sense amplifier using a second configuration signal of the second configuration circuit.

The sense control circuit may include an OR gate but typically does not include programmable devices so that the sense control circuit can be a simple and a small device. The sense amplifier may include: a first multiplexer coupled to the sense control circuit, a second multiplexer coupled to the sense control circuit, and a disable circuit. The configuration signal of the configuration circuit may be used not only for enabling or disabling the sense amplifier but also for configuring the programmable unit.

In operation, if the configuration signal of the configuration circuit configures the programmable unit so that the sense amplifier is not used in the programmable unit, and if the second configuration signal of the second configuration circuit configures the second programmable unit so that the sense amplifier is not used in the second programmable unit, then the sense control circuit disables the sense amplifier using the configuration signal and the second configuration signal. However, if the configuration signal of the configuration circuit configures the programmable unit so that the sense amplifier is used in the programmable unit, or if the second configuration signal of the second configuration circuit configures the second programmable unit so that the sense amplifier is used in the second programmable unit, then the sense control circuit enables the sense amplifier using the configuration signal or the second configuration signal.

The present invention also provides a method of enabling or disabling a sense amplifier of a programmable circuit, where the programmable circuit includes a plurality of programmable cells, the sense amplifier is coupled to the plurality of programmable cells, a programmable unit is coupled to the sense amplifier, a configuration circuit is coupled to the programmable unit, and a sense control circuit is coupled to the sense amplifier and to the configuration circuit. The method typically includes the steps of: outputting a configuration signal from the configuration circuit; configuring the programmable unit using the configuration signal; and enabling or disabling the sense amplifier using the configuration signal.

BRIEF DESCRIPTION OF THE DRAWINGS

The features, aspects, and advantages of the present invention will become more thoroughly apparent from the following detailed description, appended claims, and accompanying drawings in which:

FIG. 7 is a table comparing the amount of current drawn by some applications of a programmable circuit having all the sense amplifiers disabled according to a conventional scheme with that of the present invention; and FIG. 8 is a table comparing the amount of current drawn by a programmable circuit having disabled sense amplifiers according to a conventional scheme with that of the present invention where only half of the sense amplifiers are disabled.

DETAILED DESCRIPTION OF THE INVENTION

In the following description, numerous specific details are set forth to provide a thorough understanding of the present invention. However, one having an ordinary skill in the art may be able to practice the invention without these specific details. In some instances, well-known circuits, structures and techniques have not been shown in detail so as not to unnecessarily obscure the present invention.

Figure 1:
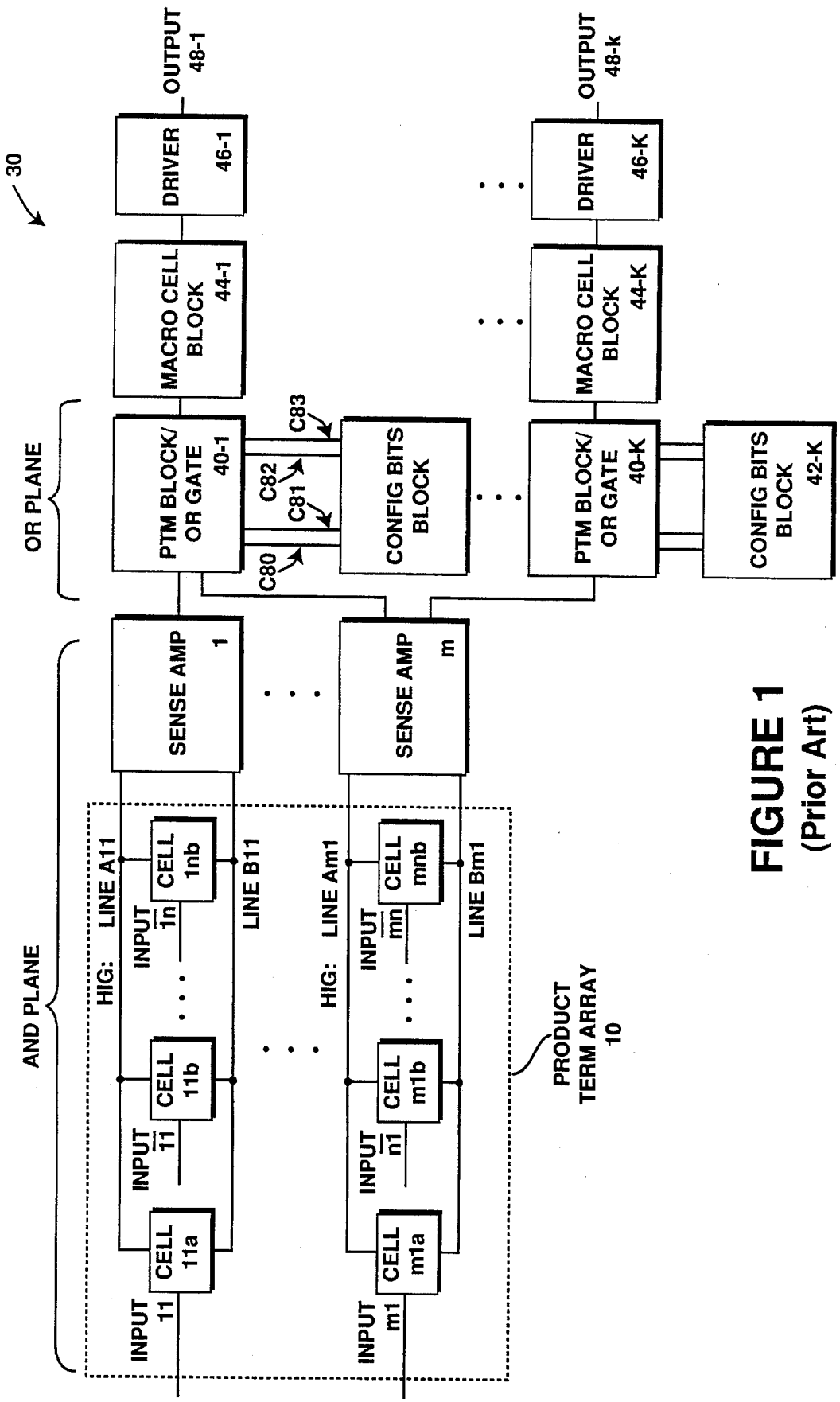
FIG. 1 is a block diagram of a conventional programmable circuit.
Figure 5:
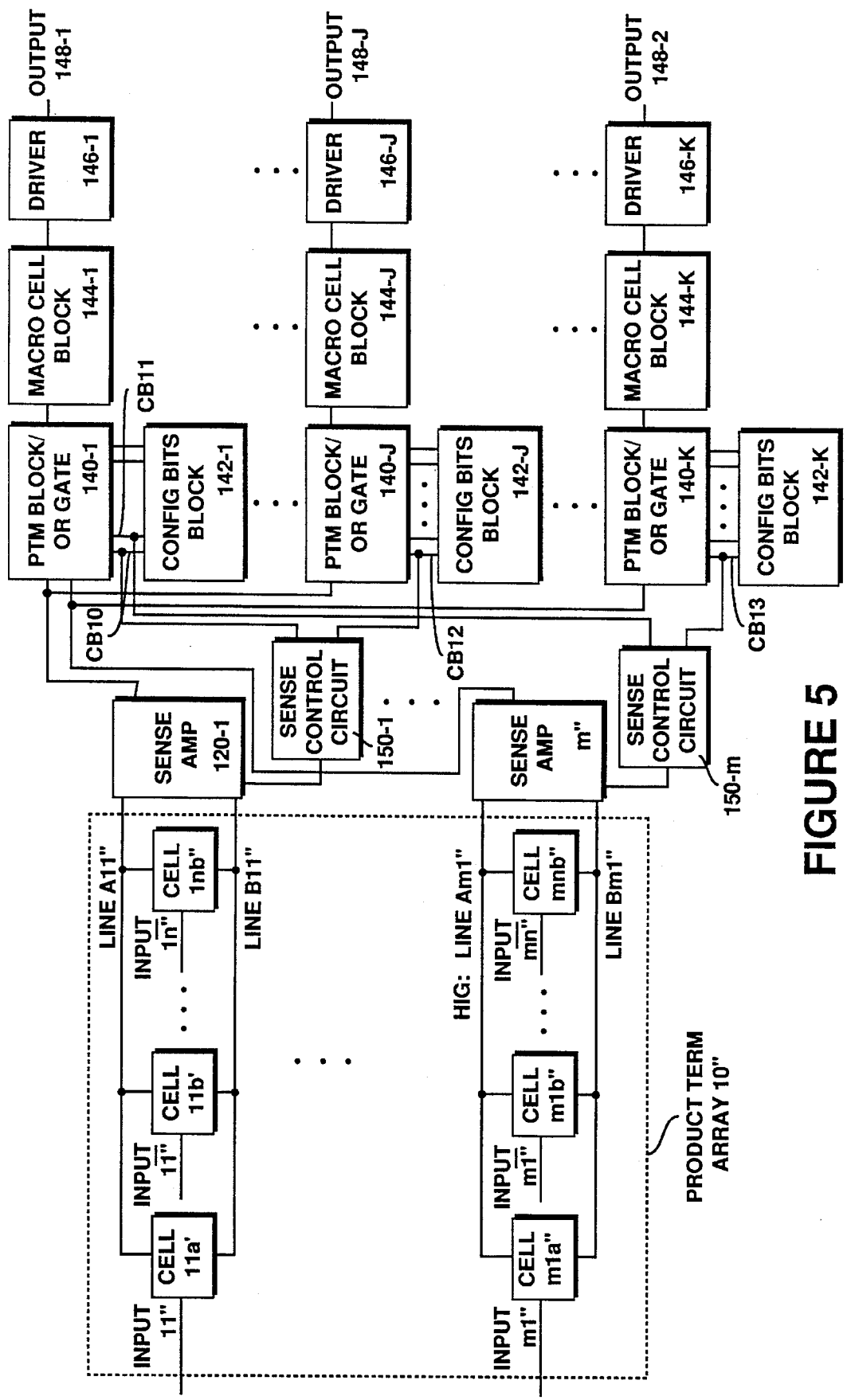
FIG. 5 is a block diagram of a programmable circuit embodying the features of the present invention.

Referring now to FIG. 5, a programmable circuit 130 embodying features of the present invention is shown. Programmable circuit 130 is similar to programmable circuit 30 in FIG. 1 except that programmable circuit 130 includes sense control circuits 150-1 through 150-m that are coupled to sense amplifiers and configuration bits blocks.

For each sense amplifier in FIG. 5, there is one corresponding sense control circuit. Each of the sense control circuits uses the configuration bits outputted by configuration bits blocks to enable or disable its corresponding sense amplifier.

For illustration purposes only, a sense amplifier 120-1 is connected to a PTM block/OR gate 140-1 and a PTM block/OR gate 140-j. The status of configuration bit CB10 from a configuration bits block 142-1 indicates whether an output of sense amplifier 120-1 is used in PTM block/OR gate 140-1. The status of configuration bit CB12 from a configuration bits block 142-j indicates whether the output of sense amplifier 120-1 is used in PTM block/OR gate 140-j.

Sense control circuit 150-1 which is connected to sense amplifier 120-1 and to configuration bits block 142-1 uses configuration bit CB10 provided by configuration bits block 142-1 and configuration bit CB12 provided by configuration bits block 142-j to determine whether sense amplifier 120-1 should be enabled or disabled.

According to one embodiment of the present invention, sense control circuit 150-1 is an OR gate. It should be noted that a sense control circuit can include other types of devices. However, it does not typically include programmable devices to make the sense control circuit simple and small.

If the output of sense amplifier 120-1 is used in at least one of the PTM blocks/OR gates, then sense amplifier 120-1 is enabled. If CB10 is high then the output of sense amplifier 120-1 is used in PTM block/OR gate 140-1, and the output of sense control circuit 150-1 is high, enabling sense amplifier 120-1. Also, if CB12 is high then the output of sense amplifier 120-1 is used in PTM block/OR gate 140-j, and sense control circuit 150-1 enables sense amplifier 120-1. The only time when sense control circuit 150-1 disables sense amplifier 150-1 is when neither PTM block/OR gate 140-1 nor PTM block/OR gate 140-j uses the output of sense amplifier 120-1. In that instance, both CB10 and CB12 are low. Hence, the output of sense control circuit 150-1 is low, disabling sense amplifier 120-1.

It should be noted that sense amplifier 120-1 can be connected to one or more PTM blocks/OR gates.

Figure 2:
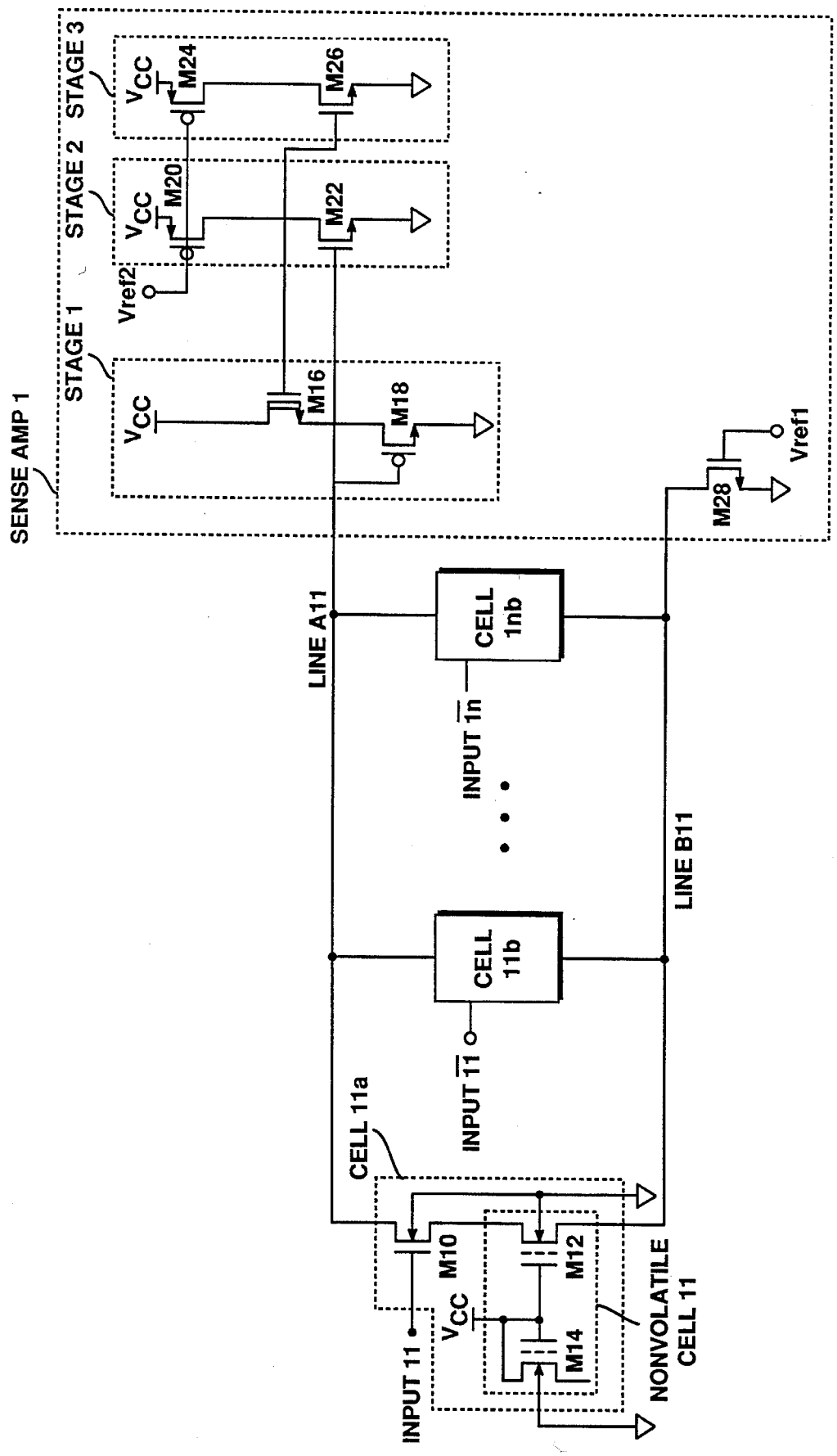
FIG. 2 is a combination of a block diagram and a circuit schematic representation of a row of the product term array and a sense amplifier in FIG. 1.
Figure 3:
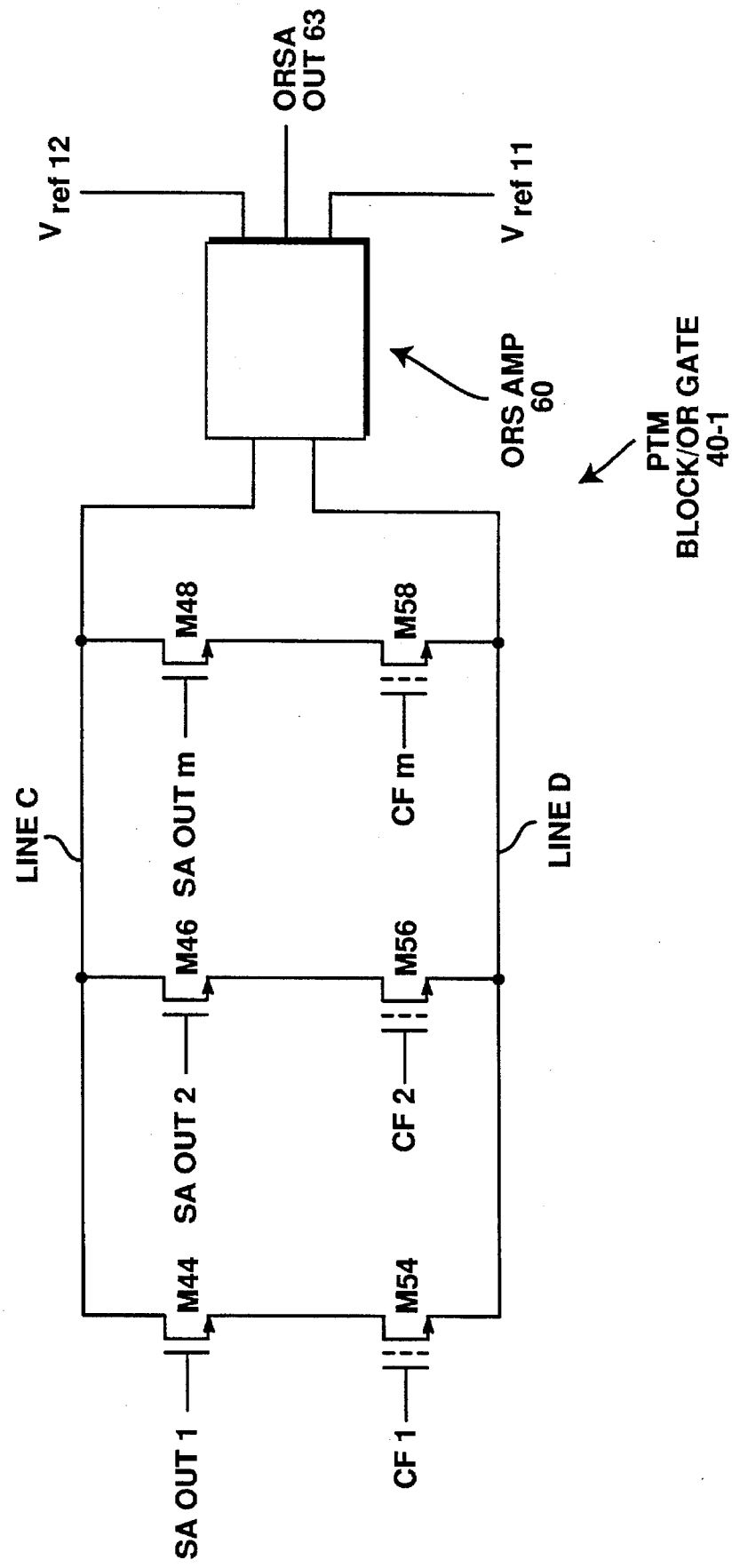
FIG. 3 is a combination of a block diagram and a circuit schematic representation of a product term matrix (PTM) block/OR gate shown in FIG. 1.
Figure 6:
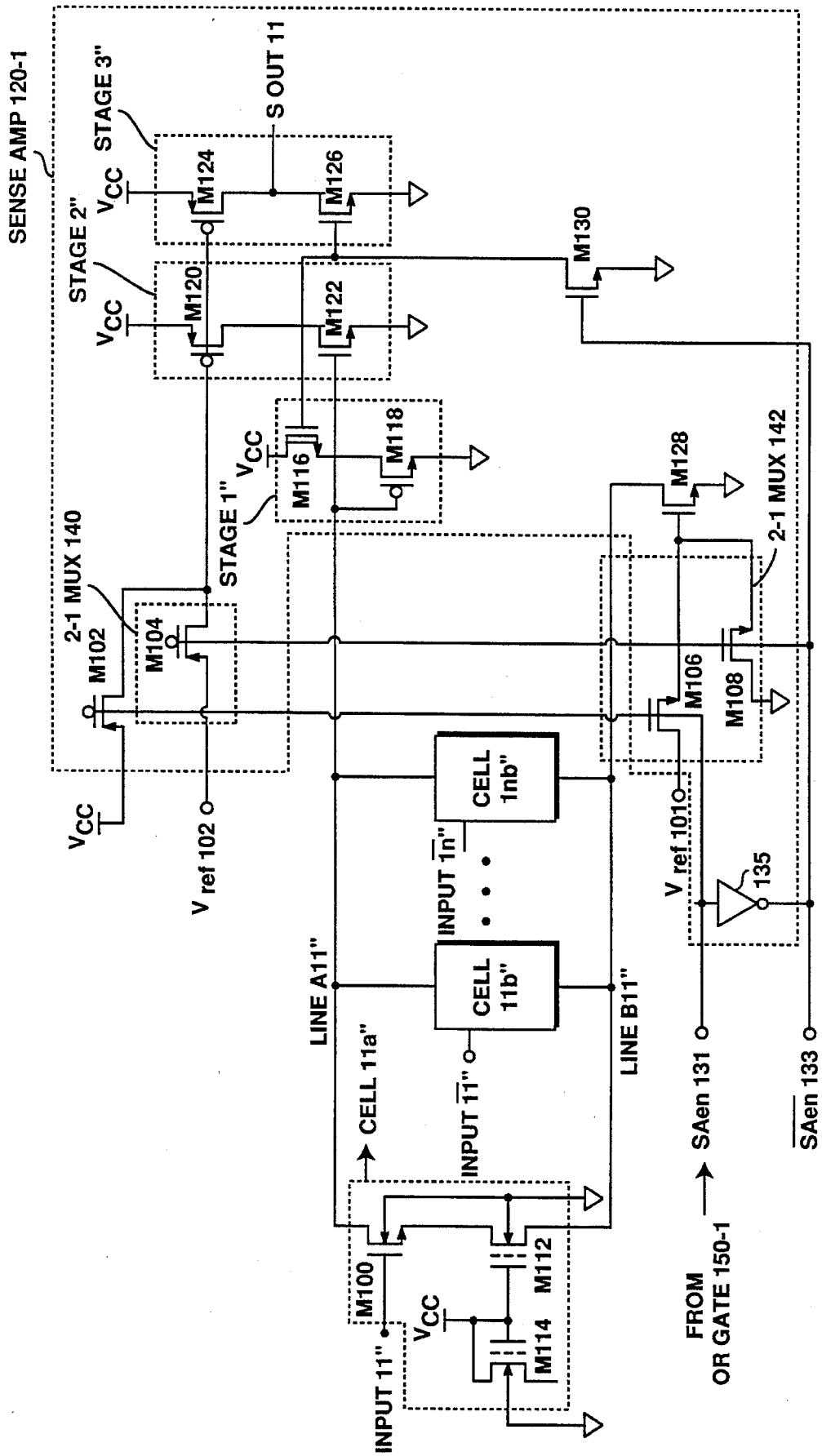
FIG. 6 is a combination of a block diagram and a circuit schematic representation of a first row of the product term array and the first sense amplifier shown in FIG. 5.

FIG. 6 is a combination of a block diagram and a circuit schematic representation of the first row of product term array 10" and sense amplifier 120-1 shown in FIG. 5 according to one embodiment of the present invention. The first row of product term array 10" is the same as the first row of product term array 10 shown in FIG. 2. Sense amplifier 120-1 in FIG. 6 is similar to sense amplifier 1 shown in FIG. 1 except that sense amplifier 120-1 includes a disabling circuit M130, a plurality of multiplexers 140 and 142, and an inverter 135. It should be noted that in another embodiment, any of disabling circuit 130, multiplexers 140 and 142, and inverter 135 can be a part of a sense control circuit instead of being part of sense amplifier 120-1 and these circuits can be implemented in a variety of different ways.

According to the embodiment shown in FIG. 6, mux 140 includes two PMOS transistors M102 and M104. The gate of transistor M102 is connected to SAen 131 which receives the output signal of sense control circuit 150-1. The source of transistor M102 is connected to Vcc. The gate of transistor M104 is connected to $\overline{\text{SAen}}$ 133 which is the inverted signal of SAen 131. The source of M104 is connected to a reference voltage Vref 102. The drains of M102 and M104 are connected to transistors M120 and M124.

Continuing to refer to FIG. 6, mux 142 includes two NMOS transistors M106 and M108. The gate of M106 is connected to SAen 131. The drain of transistor M106 is connected to a reference voltage Vref 101, and the source is connected to the gate of a current limiting device M128. The gate of transistor M108 is connected to $\overline{\text{SAen}}$ 133, the drain is connected to ground, and the source is connected to the gate of current limiting device M128.

Referring to FIGS. 5 and 6, an operation of enabling a sense amplifier is described below. For instance, if the output of sense amplifier 120-1 is used in PTM block/OR gate 140-1 or 140-j, then CB10 from configuration bits block 142-1 or CB12 from configuration bits block 142-j, respectively, is high. Hence, the output of sense control circuit 150-1 is high. When the output of sense control circuit 150-1 is high, SAen 131 is high and $\overline{\text{SAen}}$ 133 is low. Thus, transistor M106 is on and M108 is off, turning on transistor M128. In addition, transistor M102 is off and M104 is on, turning on transistors M120 and M124 where Vref 102 is connected to a voltage that is low enough to turn on M120 and M124. Thus., sense amplifier 120-1 is enabled, and the sense amplifier's output node SAout 100 will be high or low depending on the value of line A11".

Continuing to refer to FIGS. 5 and 6, an operation of disabling a sense amplifier is described. For instance, sense amplifier 120-1 is disabled if the output of sense amplifier 120-1 is not used in any of the PTM blocks/OR gates. In this case, neither PTM block/OR gate 140-1 nor PTM block/OR gate 140-j uses the output of sense amplifier 120-1. Thus, both CB10 and CB12 are low. Hence, the output of sense control circuit 150-1 is low. When the output of sense control circuit 150-1 is low, SAen 131 is low and $\overline{\text{SAen}}$ 133 is high. In that instance, transistor M106 is off and transistor M108 is on, and thus transistor M128 is inactive. Also., since transistor M104 is off and transistor M102 is on, transistors M120 and M124 are off. Because $\overline{\text{SAen}}$ 133 is high, disabling circuit M130 is on and transistor M126 is off. While there is no current flowing in stages 2" and 3", only transistors M116 and M118 are weakly turned on so that they are conducting a very small amount of current. Because transistor M118 is a very small device, the current in sense amplifier 120-1 is negligible when sense amplifier 120-1 is disabled.

FIG. 7 is a table comparing the amount of current drawn by a programmable circuit according to a conventional scheme and that of the present invention. The second column indicates the amount of current drawn by each of the devices according to the first conventional scheme described earlier where all of the sense amplifiers are disabled in a high current state when all of the programmable cells are erased in a product term array. The third column illustrates the amount of current drawn by each of the devices according to the present invention where all of the sense amplifiers are disabled by sense control circuits, such as OR gates, 150-1 through 150-m shown in FIG. 5.

For illustration purposes, devices such as CYPRESS 7C371, 7C372, 7C373, 7C374, and 7C375 are chosen to illustrate the difference in the amount of current drawn for those CPLDs. According to the first conventional scheme described earlier, device 7C371 draws 133.64 mA while the same device draws only 1.73 mA according to the present invention. Thus, the difference between the two currents is 131.92 mA. Devices 7C372 and 7C373 each draw 134.85 mA according to the first conventional scheme and only 3.44 mA according to the present invention. Hence, the difference is 131.40 mA. Devices 7C374 and 7C375 each draw 269.69 mA according to the first conventional method, and only 6.88 mA according to the present invention. Hence, the difference is 262.81 mA. Therefore, it is clear that the present invention is far superior over the first conventional scheme described earlier.

FIG. 8 is a table comparing the amount of current drawn by a programmable circuit according to a conventional scheme and the present invention where only half of the sense amplifiers are disabled. Device 7C371 draws 104.15 mA according to the conventional scheme and only 67.68 mA according to the present invention. Hence, the difference between the two currents is 36.46 mA. Devices 7C372 and 7C373 each draw 110.42 mA according to the conventional scheme. This value drops down to 69.14 mA according to the present invention. Hence, the difference between the two values is 41.28 mA. Devices 7C374 and 7C375 each produce 220.85 mA according to the conventional method. According to the present invention, the value drops down to 138.28 mA. Hence, the difference is 82.56 mA. Therefore, a programmable circuit having sense amplifiers disabled according to the present invention draws much less current than a conventional programmable circuit.

The present invention offers several advantages. First, the present invention provides a tremendous power reduction both under typical operating conditions as shown in FIG. 8 and in an erased state where all of the programmable cells of a product term array are erased. Second, the present invention reduces the total amount of programming time of a programmable circuit because the programmable cells in a product term array need not be programmed to disable the sense amplifiers. The programmable cells in a product term array need to be programmed only when sense amplifiers are enabled.

Figure 4:
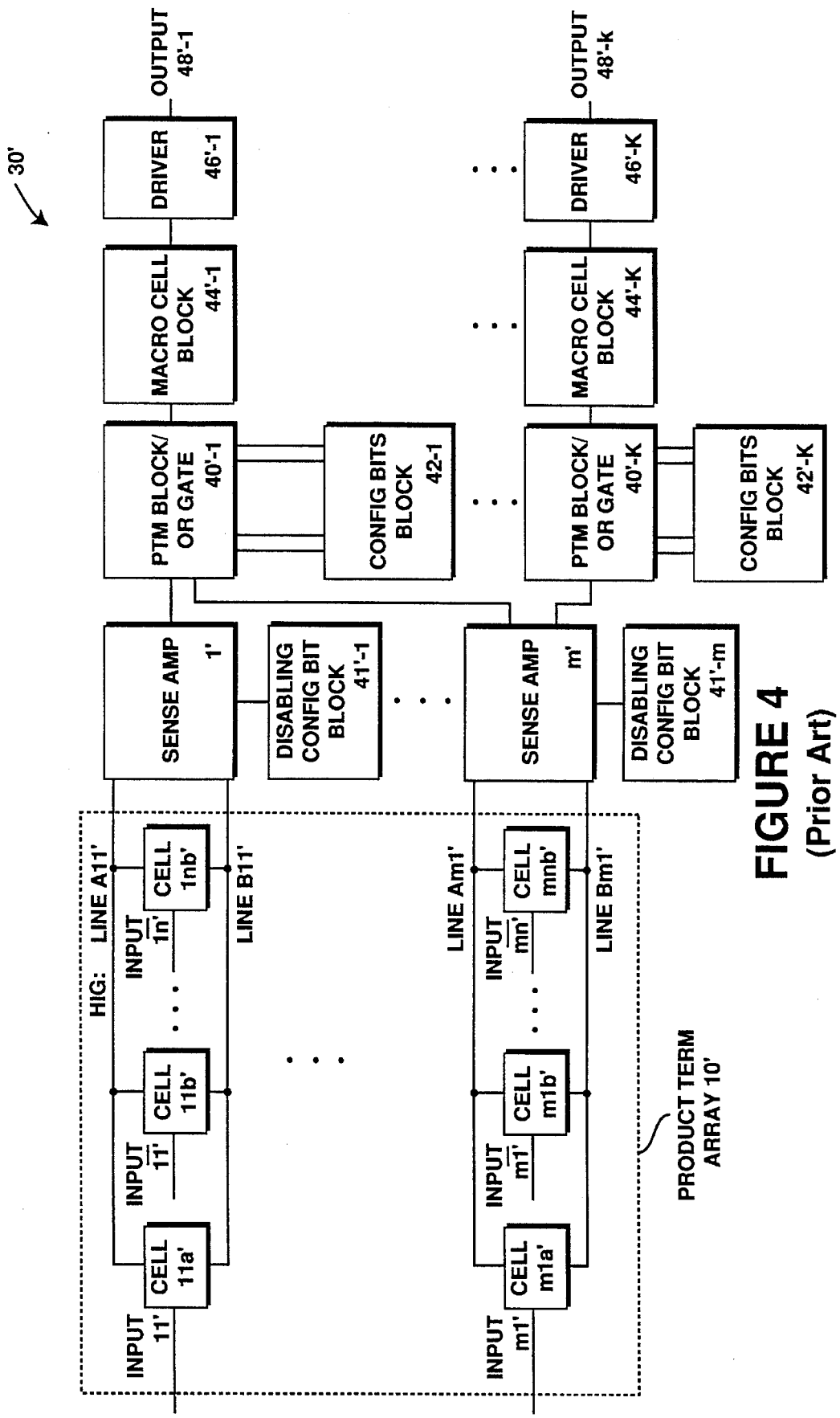
FIG. 4 is a block diagram of another conventional programmable circuit.

Third, the present invention only requires a simple circuitry (such as an OR gate) 150-1 and mux 140 and 142. Hence, the present invention requires a minimum amount of additional area. The present invention does not require additional configuration bit cells, configuration sense amplifiers, or programming circuits such as input term decoders, product term decoders, etc. that are required by disabling configuration bit blocks 41'-1 through 41'-m in FIG. 4.

Lastly, because the present invention can reduce the amount of power consumed by a programmable circuit, the operating temperature of the circuit is relatively low, and hence, the circuit performance may be improved.

While the present invention has been particularly described with reference to the various figures and embodiments, it should be understood that these are for illustration only and should not be taken as limiting the scope of the invention. Many changes and modifications may be made to the invention, by one having ordinary skill in the art, without departing from the spirit and scope of the invention.

What is claimed is:

1. A programmable circuit comprising:
   a plurality of programmable cells;
   a sense amplifier coupled to said plurality of programmable cells, said sense amplifier detecting states of said plurality of programmable cells;

a programmable unit coupled to said sense amplifier, said programmable unit for receiving a signal from said sense amplifier;

a configuration circuit coupled to said programmable unit, said configuration circuit configuring said programmable unit; and a sense control circuit coupled to said sense amplifier and to said configuration circuit, said sense control circuit enabling or disabling said sense amplifier using a configuration signal of said configuration circuit.

2. A programmable circuit according to claim 1, wherein said sense control circuit includes an OR gate.

3. A programmable circuit according to claim 1, wherein said sense control circuit includes non-programmable devices only.

4. A programmable circuit according to claim 1, wherein no additional configuration circuit is required to disable said sense amplifier.

5. A programmable circuit according to claim 1, wherein said configuration signal is used to configure said programmable unit.

6. A programmable circuit according to claim 1, wherein if said configuration signal of said configuration circuit configures said programmable unit so that said sense amplifier is not used in said programmable unit, then said sense control circuit disables said sense amplifier using said configuration signal.

7. A programmable circuit according to claim 1 further including:

a second programmable unit for receiving said signal from said sense amplifier; and a second configuration circuit for configuring said second programmable unit wherein said sense control circuit is coupled to said second configuration circuit for enabling or disabling said sense amplifier using a second configuration signal of said second configuration circuit.

8. A programmable circuit according to claim 7, wherein if said configuration signal of said configuration circuit configures said programmable unit so that said sense amplifier is not used in said programmable unit, and if said second configuration signal of said second configuration circuit configures said second programmable unit so that said sense amplifier is not used in said second programmable unit, then said sense control circuit disables said sense amplifier using said configuration signal and said second configuration signal.

9. A programmable circuit according to claim 7, wherein if said configuration signal of said configuration circuit configures said programmable unit so that said sense amplifier is used in said programmable unit, or if said second configuration signal of said second configuration circuit configures said second programmable unit so that said sense amplifier is used in said second programmable unit, then said sense control circuit enables said sense amplifier using said configuration signal and said second configuration signal.

10. A programmable circuit according to claim 1, wherein said sense amplifier includes:

a first multiplexer coupled to said sense control circuit; and a second multiplexer coupled to said sense control circuit.

11. A programmable circuit according to claim 1, wherein said sense amplifier includes:

a first gain stage coupled to said plurality of programmable cells;

a second gain stage coupled to said first gain stage;

a third gain stage coupled to said second gain stage for generating a signal representing one of said states a disable circuit coupled to said first, second and third stages and to said sense control circuit;

a current limiting device coupled to said plurality of programmable cells;

a first multiplexer coupled to said second and third gain stage and to said sense control circuit; and a second multiplexer coupled to said current limiting device and to said sense control circuit.

12. A programmable circuit according to claim 11, wherein said first multiplexer includes:

a first PMOS transistor having a gate, a drain, and a source; and a second PMOS transistor having a gate, a drain, and a source, wherein said second multiplexer includes:

a first NMOS transistor having a gate, a drain, and a source; and a second NMOS transistor having a gate, a drain, and a source.

13. A programmable circuit according to claim 12, wherein said first gain stage includes:

a depletion-type MOS transistor having a gate, a drain, and a source; and a third NMOS transistor having a gate, a drain, and a source, wherein said second gain stage includes:

a third PMOS transistor having a gate, a drain, and a source; and a fourth NMOS transistor having a gate, a drain, and a source, wherein said third gain stage includes:

a fourth PMOS transistor having a gate, a drain, and a source; and a fifth NMOS transistor having a gate, a drain, and a source, wherein said disable circuit includes a sixth NMOS transistor having a gate, a drain, and a source, and wherein said current limiting circuit includes a seventh NMOS transistor having a gate, a drain, and a source.

14. A programmable circuit according to claim 13, wherein the gate of said first PMOS transistor is coupled to said sense control circuit, the source of said first PMOS transistor is for coupling to a first voltage supply, and the drain of said first PMOS transistor is coupled to the gates of said third and fourth PMOS transistors, wherein the gate of said second PMOS transistor is coupled to said sense control circuit through an inverter, the source of said second PMOS transistor is for coupling to a first voltage reference, and the drain of said second PMOS transistor is coupled to the gates of said third and fourth PMOS transistors, wherein the gate of said first NMOS transistor is coupled to said sense control circuit, the drain of said first NMOS transistor is for coupling to a second voltage reference, and the source of said first NMOS transistor is coupled to the gate of said seventh NMOS transistor, wherein the gate of said second NMOS transistor is coupled to said sense control circuit through said inverter, the drain of said second NMOS transistor is for coupling to a second voltage supply, and the source of said second NMOS transistor is coupled to the gate of said seventh NMOS transistor, wherein the gate of said depletion-type MOS transistor is coupled to the drain of said sixth NMOS transistor, the drain of said depletion-type MOS transistor is for coupling to said first voltage supply, and the source of said depletion-type MOS transistor is coupled to said plurality of programmable cells, wherein the gate and the drain of said third NMOS transistor are coupled to the source of said depletion-type MOS transistor, and the source of said third NMOS transistor is coupled to said second voltage supply, wherein the source of said third PMOS transistor is for coupling to said first voltage supply, and the drain of said third PMOS transistor is coupled to the gate of said depletion-type MOS transistor, wherein the gate of said fourth NMOS transistor is coupled to the source of said depletion-type MOS transistor, the drain of said fourth NMOS transistor is coupled to the gate of said depletion-type MOS transistor, and the source of said fourth NMOS transistor is for coupling to said second voltage supply, wherein the source of said fourth PMOS transistor is for coupling to said first voltage supply, wherein the gate of said fifth NMOS transistor is coupled to the gate of said depletion-type MOS transistor, the drain of said fifth NMOS transistor is coupled to the drain of said fourth PMOS transistor, and the source of said fifth NMOS transistor is for coupling to said second voltage supply, wherein the gate of said sixth NMOS transistor is coupled to said sense control circuit through said inverter, the drain of said sixth NMOS transistor is coupled to the gate of said fifth NMOS transistor, the source of said sixth NMOS transistor is for coupling to said second voltage supply, and wherein the gate of said seventh NMOS transistor is coupled to the source of said first NMOS transistor, the drain of said seventh NMOS transistor is coupled to said plurality of programmable cells, the source of said seventh NMOS transistor is for coupling to said second voltage supply.

15. A programmable circuit according to claim 1 further including:

a latch circuit for latching an output signal from said programmable unit; and a driving circuit for receiving an output signal from said latch circuit and driving an output of said programmable circuit.

16. A programmable circuit according to claim 1, wherein said plurality of programmable cells and said sense amplifier are in an AND plane of said programmable circuit, and wherein said programmable unit and said configuration circuit are in an OR plane of said programmable circuit.

17. A programmable circuit comprising:

a plurality of programmable cells;

sensing means for detecting states of said plurality of programmable cells;

programmable means for receiving a signal from said sensing means;

configuration means for configuring said programmable means; and sense control means for enabling or disabling said sensing means using a configuration signal of said configuration means.

18. A method of enabling or disabling a sense amplifier of a programmable circuit, wherein said programmable circuit includes a plurality of programmable cells, said sense amplifier coupled to said plurality of programmable cells, a programmable unit coupled to said sense amplifier, a configuration circuit coupled to said programmable unit, and a sense control circuit coupled to said sense amplifier and to said configuration circuit, the method comprising the steps of:

outputting a configuration signal from said configuration circuit;

configuring said programmable unit using said configuration signal; and enabling or disabling said sense amplifier using said configuration signal.

19. A method according to claim 18, wherein if said configuration signal of said configuration circuit configures said programmable unit so that said sense amplifier is not used in said programmable unit, then said sense control circuit disables said sense amplifier using said configuration signal.

20. A method according to claim 18, wherein if said configuration signal of said configuration circuit configures said programmable unit so that said sense amplifier is used in said programmable unit, then said sense control circuit enables said sense amplifier using said configuration signal.

21. A method according to claim 18, wherein said sense control circuit includes non-programmable devices only.

22. A method according to claim 18, wherein said sense control circuit includes logic gates.

* * * * *